United States Patent [19]
Green

[11] Patent Number: 5,204,520
[45] Date of Patent: Apr. 20, 1993

[54] AVALANCHE PHOTODIODE ARRAY INTEGRATED WITH ETCHED SILICON DIVIDER

[75] Inventor: Samuel I. Green, St. Louis, Mo.

[73] Assignee: McDonnell Douglas Corporation, St. Louis, Mo.

[21] Appl. No.: 811,749

[22] Filed: Dec. 23, 1991

[51] Int. Cl.$^5$ .............................................. H01J 40/14
[52] U.S. Cl. .................................. 250/214.1; 257/431
[58] Field of Search ............... 250/201.1, 208.6, 211 J, 250/208.2, 216; 357/30 A, 30 L; 359/851, 857; 369/44.41

[56] References Cited

U.S. PATENT DOCUMENTS 4,057,476  11/1977  Krikorian et al. ................ 250/211 J
4,989,972   2/1991  Braun ............................... 250/211 J

OTHER PUBLICATIONS

Samuel I. Green, Optical Dividers for Quadrant Avalanche Photodiode Detectors; Conference held Jan. 22, 1991.

Primary Examiner—David C. Nelms
Assistant Examiner—K. Shami
Attorney, Agent, or Firm—Guy R. Gosnell; Benjamin Hudson, Jr.; Timothy H. Courson

[57] ABSTRACT

An avalanche photodiode array comprising a plurality of photosensitive regions in a light sensitive body with each photosensitive region having a semiconductor junction. Between said photosensitive regions, there are a plurality of low response regions separating the photosensitive regions. A plurality of wedged shaped regions having a reflective coating on their surface are placed on the light sensitive body to cover the low response regions and to reflect incident light rays towards a photosensitive region; such incident light rays typically arriving at the photosensitive regions at angles of grazing incidence. Back reflector regions having a reflective coating on their surface are positioned about the periphery of the light entry surface to reflect light incident thereon to a photosensitive region. Placed upon the surface of the photosensitive elements is an antireflection coating comprised of a low loss material having a high index of refraction such that light rays incident on the photosensitive element at an angle of grazing incidence may deliver substantially all of their energy either to the photosensitive region so as to be detected or to the reflected rays to be reflected by the back reflector and subsequently detected, rather than having their energy dissipated by heat loss in a more lossy antireflection coating. The index of refraction of the anti-reflecting coating is approximately equal to the square root of the index of refraction of the material from which a light sensitive body is comprised.

7 Claims, 1 Drawing Sheet

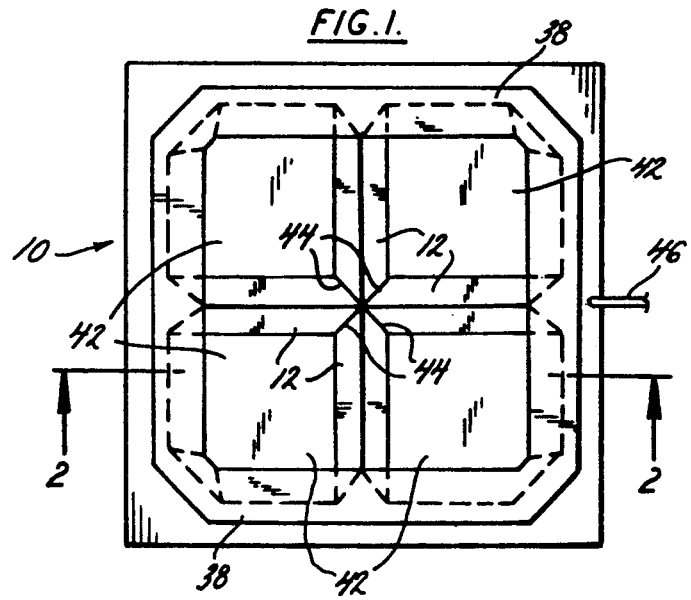
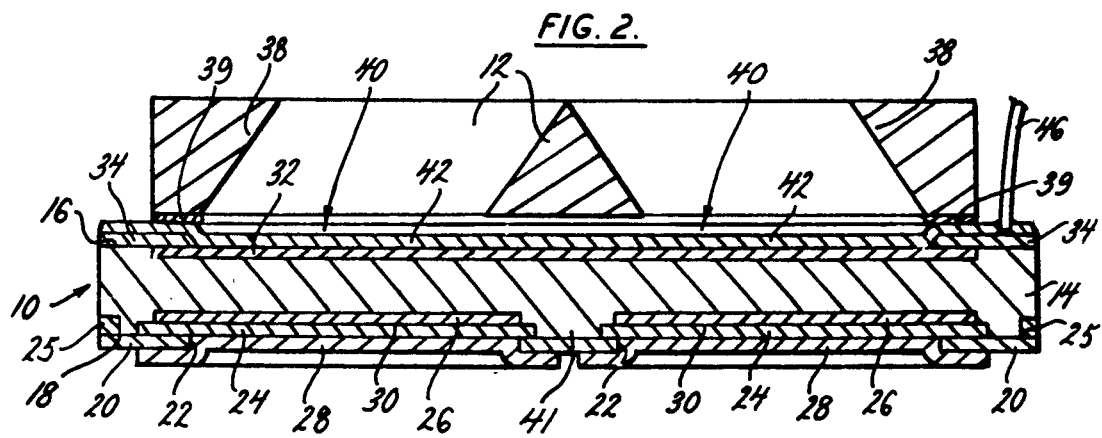
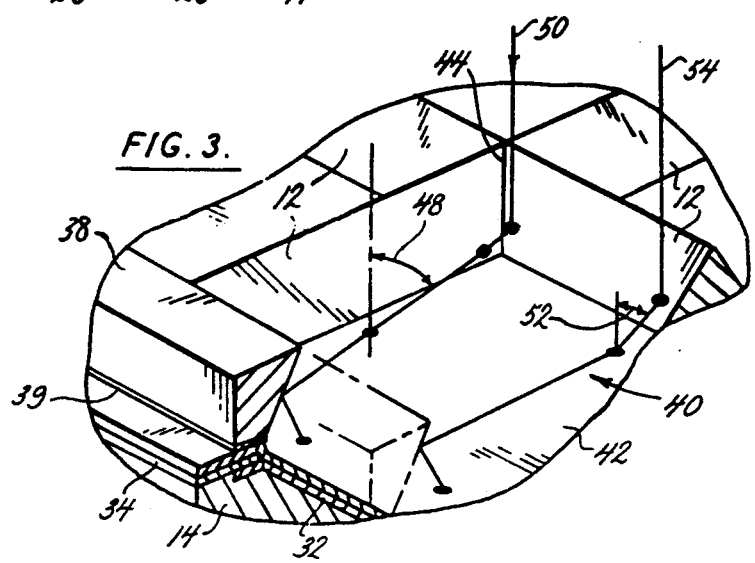

AVALANCHE PHOTODIODE ARRAY INTEGRATED WITH ETCHED SILICON DIVIDER

BACKGROUND OF THE INVENTION

This invention relates to quadrant arrays of photodetectors and in particular to avalanche photodiode (APD) arrays in which the transition regions between quadrant array elements are bridged by a reflective optical divider which causes radiation to be incident on photosensitive surfaces at large angles from normal incidence and in which the surfaces of the photosensitive region of the array are coated with an antireflection coating material.

Modern optical acquisition and tracking applications often require the use of a plurality of photodetectors in order to steer the boresight of the optical system toward the target. An APD array such as a quadrant avalanche photodiode (QAPD) having four photosensitive elements arranged in quadrants may be used in place of four separate photodetectors with image dividing optics to reduce the size and weight of the photodetector assembly.

Two different types of QAPD's have been developed. The first type of QAPD was a P-side divided QAPD which had a P-type light entry side contact divided into quadrants with higher resistance Pi-type material in the transition regions between the quadrants. The P-side divided QAPD suffered from several deficiencies, however, including crosstalk between the quadrants due to undepleted material in the transition region between quadrants. Additionally, the P-side divided QAPD had a significant amount of Johnson noise current due to the transition region leakage resistance which was detrimental in low bandwidth tracking applications.

Subsequently, a QAPD divided on the N-type Junction side (J-QAPD) was developed. The J-QAPD had no leakage resistance between the quadrants so that it performed better than the P-side divided QAPD in all areas except for its lack of response to signals received in the transition region between quadrants. Thus, while the J-QAPD lacked crosstalk and Johnson noise, the J-QAPD suffered from a dead zone in which carriers photogenerated by the incident light in the transition region between photosensitive quadrants were lost and did not contribute to the photodiode's output.

Numerous attempts have been made to provide an optical divider configuration which could be mounted upon the J-QAPD to bridge the dead zone and deflect light impinging upon the dead zone into a sensitive region of a quadrant, and thus provide a small effective transition region. In one approach, a mirrored prism structure with an acute angle and a very fine edge has been utilized to straddle the dead zone and deflect light into the appropriate quadrant. Typically, this mirror prism structure is comprised of silicon which has been photolithographically masked and etched to form the prism structure and coated with chrome and gold to provide a reflective surface for the impinging light rays.

The Etched Silicon Divider (ESD) forms a prism with an apex angle of 70.6 degrees which deflects the light rays at too shallow an angle for all of them to strike the underlying J-QAPD within its sensitive region. For example, rays which strike near the apex of the divider pass above the photosensitive surface and strike outside the sensitive diameter, especially near the edges. A back reflector was incorporated into the design of the ESD in order to capture the rays directed beyond the sensitive region and to deflect them downwards towards a sensitive region of the J-QAPD. While this ESD design incorporating the back reflector greatly improved the performance of the J-QAPD/ESD combination, this design still exhibited characteristic losses near the base of the reflecting prism surfaces and especially near its center along the 45 degree diagonal lines which divided each quadrant. These losses corresponded to impinging rays which hit near the base of the reflecting prism surfaces. The rays reflecting from the mirrored prism surfaces strike the sensitive region at a variety of angles and are expected to be absorbed by the photodetector or reflected toward the back reflector and subsequently photodetected. However, in prior art devices, the rays striking the sensitive region near the base of the mirrored prisms suffered unexplained losses and were thus not useful to many applications which require that all incident signal contribute to the measurement.

The impinging rays which hit near the base of the mirrored prism close to the diagonals are reflected from two intersecting faces of the mirrored wedge shaped dividers prior to striking a photosensitive region at an angle typically greater than 80 degrees form the normal. The impinging rays which hit near the base of the mirrored prism away from the center are reflected once and subsequently impinge upon the photosensitive region at an angle typically greater than 70 degrees from the normal. Rays which are incident on the mirrored prism and take one or two reflections before striking the photosensitive region arrive at very steep angles of incidence. The grazing angle of incidence at which the ray strikes the photosensitive region is typically a very large angle as measured form the normal to the surface of the sensitive region such as greater than 70 degrees. It is desirable that the rays striking the sensitive region at such a large angle would be photodetected (absorbed) or reflected toward the back reflector and subsequently photodetected. However, in prior art devices, the ray striking the sensitive region at such a large angle from the surface's normal lost a substantial portion of its energy passing through the antireflection coating upon the sensitive region and thus contributed very little to the desired output signal.

A large loss of energy by the ray striking the sensitive region at a grazing angle of incidence is typically due to the heat produced during the rays travel through the antireflection coating deposited upon the photosensitive surface. This antireflection coating has typically been silicon monoxide (SiO) which absorbs a large portion of the ray's energy and dissipates it as heat when the ray strikes the antireflection coating at such an angle so that a long path length is travelled prior to its arrival at the sensitive region. While silicon monoxide is an inefficent coating in this instance due to its inherent optical loss, silicon monoxide is generally an excellent choice for the antireflection coating material since the losses introduced are small for light rays entering substantially perpendicular to the surface of the J-QAPD.

That portion of the ray's energy reflected from the coated photodetector surface reaches the back reflector which redirects it toward a photosensitive region, however, the amount of energy delivered to the photosensitive region by this redirected ray is typically very small due to the previous dissipation of energy within the antireflection coating on the photosensitive region.

Therefore, a J-QAPD/ESD combination would be desirable which exhibited no characteristic losses along the base of the prism neither near its center along the 45 degree diagonal lines dividing the quadrants nor away from its center so that impinging light rays striking the lower portion of any prisms could effectively contribute to the output signal of the J-QAPD. Furthermore, it would be desirable for a J-QAPD to be developed having antireflection coatings comprised of a material exhibiting low loss so that substantially all the energy of the impinging light ray would reach the photosensitive region of the J-QAPD to provide a useful output

SUMMARY OF THE INVENTION

There is provided by this invention an avalanche photodiode array comprising a plurality of photosensitive regions in a light sensitive body with each photosensitive region having a semiconductor junction. Between said photosensitive regions, there are a plurality of low response regions which separate the photosensitive regions. A plurality of wedge shaped regions having a reflective coating on their surface are placed on the light sensitive body so as to cover the low response regions and to reflect incident light rays towards a photosensitive region. Back reflector regions are also provided having a reflective coating on their surface and positioned about the periphery of the light entry surface so as to reflect light incident thereon to a photosensitive region as well. Placed upon the surface of the photosensitive elements is an antireflection coating comprised of a low loss material having a high index of refraction.

The antireflection coating is comprised of a low loss material such that light rays incident on the photosensitive element at an angle of grazing incidence may deliver substantially all of their energy either to the photosensitive region so as to be detected or to the reflected rays to be reflected again by the back reflector and subsequently detected, rather than having their energy dissipated as heat in a more lossy antireflection coating. The index of refraction of the anti-reflecting coating is approximately equal to the square root of the index of refraction of the material from which a light sensitive body is comprised. For a light sensitive body of silicon the antireflection coating should have an index of refraction within the range of 1.7 to 2.0. Examples of suitable antireflection coatings are hafnium oxide ($HfO_2$) and scandium oxide ($Sc_2O_3$). While such an avalanche photodiode array may be comprised of any number of photosensitive regions, typically, the photodiode array is a junction side divided quadrant avalanche photodiode array having four spaced apart photosensitive elements within the light entry body.

BRIEF DESCRIPTION OF THE DRAWINGS

FIG. 1 is a top view of a junction side divided quadrant avalanche photodiode array with an etched silicon optical divider incorporating the principles of this invention;

FIG. 2 is a cross sectional view of the junction side divided quadrant avalanche photodiode array with an etched silicon optical divider illustrated in FIG. 1 taken along line 2—2; and FIG. 3 is an isometric view of a junction side divided quadrant avalanche photodiode array with an etched silicon optical divider illustrating the optical path of light rays striking the photosensitive region at an angle of grazing incidence.

DETAILED DESCRIPTION OF THE PREFERRED EMBODIMENT

Referring to FIGS. 1 and 2, there is shown a 2-by-2 J-QAPD array 10 having wedged shaped optical dividers 12 placed upon the photodiode array's surface. A cross section of the J-QAPD is shown in FIG. 2 and includes a light sensitive semiconductor body 14 of Pi-type material having opposed major surfaces 16 and 18. A passivation layer 20 having four openings 22 therethrough overlies the major surface 18. Each element of the array is typically composed of an N(+)-type conductivity region 24, a P-type conductivity region 26, and an electrical contact 28 to the N(+)-type region 24 in the openings 22 of the passivation layer 20. The P-N junctions 30 of the elements are formed at the interface between the N(+)-type region 24 and P-type region 26. The N(+)-type regions 24 extend along the surface 18 toward one another but do not contact one another. While the P-type regions 26, which contain a non-uniform uncompensated concentration of acceptors extend a further distance into the body 14 from the N(+)-type regions 24, are not shown to contact one another, such P-type regions 26 may overlap one another in their regions between the N(+)-type regions 24. Additionally, a channel stop 25 may be formed about the periphery of the photosensitive regions as is well known to those skilled in the art. Additionally, a P(+)-type contacting region 32 containing an excess concentration of acceptors typically extends a distance into the body 14 form the surface 16. An electrical contact 34 then overlies the periphery of the surface 16 to make electrical contact with the contacting region 32. The J-QAPD 10 is thus divided into four photosensitive quadrants 40 due to the four openings 22 in the passivation layer 20, each quadrant having an independent N-side contact 28 and all quadrants having a common P-side contact 34.

Overlying the major surface 16 of the J-QAPD 10 is a reflector body 12 and a back reflector 38 adhered to the surface 16 typically with an adhesive layer 39. The reflector body 12 includes a plurality of spaced apart wedges with a reflective coating, such as chrome and gold, upon the surfaces of the wedges. The reflector body 12 is positioned on the surface 16 such that the wedges are located over the low response regions 41 between the P-N junctions 30 forming the photosensitive regions 40 of the J-QAPD. The surface of the back reflector 38 is also coated with a reflective coating such as chrome and gold. The back reflector 38 is located about the periphery of the photosensitive regions 40 of the J-QAPD 10 as shown in FIG. 1. The back reflector 38 and the reflector body 12 are typically formed from a single piece of material but may be independently formed from separate pieces of material.

Prior to the adherence of the reflector body 12 and the back reflectors 38 to the major surface 16 of the array 10, the major surface 16, which has previously been coated with an electrical contact 34 about the J-QAPD's periphery, is coated with an antireflection coating 42, as shown in FIG. 2, to permit the photosensitive areas 40 of the J-QAPD 10 to absorb a greater percentage of the impinging light rays that would be lost due to fresnel reflection as is commonly known to those skilled in the art. Protruding through such a coating 42 is electrical lead 46 to permit electrical contact with the P-side contact 34. While silicon monoxide has typically been utilized effectively as an antireflection coating for light rays of near normal incidence, such a silicon monoxide coating exhibits high loss to light rays impinging on the antireflection coating at a grazing angle of incidence. Such grazing rays travel a lengthy optical path through the coating and lose a substantial portion of their energy in heat so that the photosensitive region 40 would not sufficiently measure the energy of the impinging light ray. The antireflection coating 42 of this invention is comprised of a low loss material such that all light rays, including those impinging on the coating 42 at a grazing incidence, are transmitted through the coating 42 to the photosensitive region 40 with little loss in heat or are reflected toward the back reflector 38 which reflects the light toward the photosensitive region 40 at an angle much closer to normal incidence to the surface. In either instance, the photosensitive region 40 can now properly measure the energy of the impinging light ray. Additionally, the antireflection coating 42 is typically selected to have an index of refraction which is approximately equal to the square root of the index of refraction of the material comprising the body 14 of the J-QAPD 10. Thus, for J-QAPD's comprised of silicon, the antireflection coating would ideally be in the 1.7 to 2.0 range of refraction indices. Typical low loss coatings which would be suitable for use with a silicon body are hafnium oxide ($HfO_2$) and scandium oxide ($Sc_2O_3$).

The light rays traveling the longest path through the antireflection coating 42 are those which struck the coating at a grazing incidence, typically the rays, as shown in FIG. 3, which had originally impacted the J-QAPD 10 near its center along a diagonal 44 dividing the quadrants 40 such that it was reflected from a pair of orthogonal wedge shaped dividers 12 prior to striking the coating 42 at a large angle 48 from a normal to the surface of the coating 42. Such a ray 50 and its optical path is shown in FIG. 3. By fabricating the antireflection coating 42 from a low loss material having a suitable index of refraction, little loss of energy is suffered by the light's passage through the antireflection coating 42 and the photosensitive region 40 may more accurately measure the energy of the light ray 50 upon its original receipt by the J-QAPD 10.

Light rays striking the antireflection coating 42 at a slightly smaller angle from normal incidence, typically the rays, as shown in FIG. 3, which originally impact the J-QAPD 10 near the base of a single wedge reflector 12 such that it strikes the coating 42 at a large angle 52 form a normal to the surface o the coating 42 also incur substantial losses during their passage through the coating 42. Such a ray 54 and its optical path is also shown in FIG. 3. By fabricating the antireflection coating 42 from a low loss material having a suitable index of refraction, little loss of energy is suffered by the light's passage through the antireflection coating 42 and the photosensitive region 40 may more accurately measure the energy of the light ray 50 upon its original receipt by the J-QAPD 10.

While an APD with a low loss antireflection coating has been discussed in conjunction with a 2-by-2 area array of detectors, such a design utilizing a low loss antireflection coating to decrease losses in incident light ray's energy upon their striking a photosensitive surface, particularly at large angles from the normal to the surface, may be utilized in other photodetector configurations, regardless of whether the detector has avalanche gain, a divider or a back reflector, including a detector having only a single element. Such a device photodetects or reflects light incident at any angle with minimal waste of energy dissipated as heat.

Although there has been illustrated and described specific detail and structure of operations it is clearly understood that the same were merely for purposes of illustration and that changes and modifications may be made readily therein by those skilled in the art without departing from the spirit and scope of this invention.

I claim:

1. An avalanche photodiode array, comprising:
   a) a body of light-sensitive semiconductor material having a light entry surface and a plurality of spaced-apart elements therein, each element including a semiconductor junction therein, thereby forming a plurality of photosensitive regions about said elements;
   b) a plurality of wedge-shaped regions having a light-reflective coating overlaying the surfaces thereof and positioned between the spaced-apart elements for reflecting light incident thereon into a photosensitive region of the body;
   c) a back reflector region having a light-reflective coating overlaying the surfaces thereof and positioned about the periphery of the light entry surface for reflecting light incident thereon into a photosensitive region of the body; and
   d) an antireflection coating placed upon the plurality of spaced-apart photosensitive elements.

2. An avalanche photodiode array as recited in claim 1 wherein the antireflection coating has an index of refraction substantially equal to the square root of the index of refraction of the light-sensitive semiconductor material.

3. An avalanche photodiode array as recited in claim 1 wherein the body is substantially comprised of silicon.

4. An avalanche photodiode array as recited in claim 3 wherein the antireflection coating has an index of refraction within the range of 1.7 to 2.0.

5. An avalanche photodiode array as recited in claim 1 wherein the antireflection coating is selected from the group consisting of hafnium oxide ($HfO_2$) and scandium oxide ($Sc_2O_3$).

6. An avalanche photodiode array as recited in claim 1 wherein the array is a quadrant avalanche photodiode array having four spaced-apart photosensitive elements within the light entry surface.

7. An avalanche photodiode array as recited in claim 1 wherein the back reflector region is of sufficient height to reflect all light rays which initially struck a wedge-shaped region.

* * * * *